United States Patent
Delaet et al.

(10) Patent No.: US 9,593,966 B2
(45) Date of Patent: Mar. 14, 2017

(54) MAGNETIC FIELD SENSOR

(71) Applicants: Commissariat à l'énergie atomique et aux énergies alternatives, Paris (FR); Renault S.A.S., Boulogne-Billancourt (FR)

(72) Inventors: Bertrand Delaet, Bernin (FR); Sylvain Bacquet, Chasselay (FR)

(73) Assignees: Commissariat à l'énergie et aux énergies alternatives, Paris (FR); Renault S.A.S., Boulogne-Billancourt (FR)

( * ) Notice: Subject to any disclaimer, the term of this patent is extended or adjusted under 35 U.S.C. 154(b) by 221 days.

(21) Appl. No.: 14/371,484

(22) PCT Filed: Jan. 7, 2013

(86) PCT No.: PCT/EP2013/050155
§ 371 (c)(1),
(2) Date: Jul. 10, 2014

(87) PCT Pub. No.: WO2013/104584
PCT Pub. Date: Jul. 18, 2013

(65) Prior Publication Data
US 2015/0008915 A1    Jan. 8, 2015

(30) Foreign Application Priority Data

Jan. 12, 2012 (FR) ...................................... 12 50313

(51) Int. Cl.
*G01R 33/09* (2006.01)
*G01D 5/16* (2006.01)
(Continued)

(52) U.S. Cl.
CPC ............. *G01D 5/16* (2013.01); *G01R 15/205* (2013.01); *G01R 33/0017* (2013.01); *G01R 33/09* (2013.01)

(58) Field of Classification Search
CPC   G01D 5/16; G01D 1/00; G01D 21/00; G01D 15/00; G01R 33/09; G01R 15/18;
(Continued)

(56) References Cited

U.S. PATENT DOCUMENTS

2006/0291106 A1    12/2006 Shoji
2007/0159159 A1*   7/2007 Okada .................. G01R 15/205
                                                   324/117 H (Continued)

FOREIGN PATENT DOCUMENTS

FR       2 902 890       12/2007
WO       2007148028      12/2007

*Primary Examiner* — Arleen M Vazquez
*Assistant Examiner* — Brent J Andrews
(74) *Attorney, Agent, or Firm* — Occhiuti & Rohlicek LLP

(57) ABSTRACT

A sensor of magnetic fields along a direction of measurement comprising N magneto-resistive transducers $TM_i$, a resistance of each transducer $TM_i$ varying linearly to within $\pm x_i\%$ as a function of an intensity of a magnetic field to be measured within a maximum range $[a_i; b_i]$ of intensity of the magnetic field to be measured and non-linearly outside of this range, the index i being an identifier of the transducer $TM_i$. The sensor further comprises a generator which generates N magnetic fields $CM_i$ using at least one permanent magnet, where each magnetic field $CM_i$ exhibits an intensity $I_i$ in the direction of measurement. The intensity $I_i$ being constant and independent of the intensity of the magnetic field to be measured and each transducer $TM_i$ being placed inside a respective magnetic field $CM_i$. Each transducer $TM_i$ placed inside the magnetic field $CM_i$ forming a measurement block for which the range in which the resistance of the (Continued)

transducer $TM_i$ of said block varies linearly to within $\pm x_i\%$ is offset by $I_i$ and becomes $[a_i+I_i; b_i+I_i]$. Each intensity $I_i$ being different from the others so as to obtain N different ranges $[a_i+I_i; b_i+I_i]$, being an integer number greater than or equal to two. There is further included a computer capable of selecting one or more measurement blocks for which the intensity of the magnetic field to be measured lies within the range $[a_i+I_i; b_i+I_i]$ of the block, and establishing the measurement of the intensity of the magnetic field on the basis of the measurement of only the one or more measurement blocks selected.

14 Claims, 2 Drawing Sheets

(51) Int. Cl.
  *G01R 33/00* (2006.01)
  *G01R 15/20* (2006.01)
(58) Field of Classification Search
  CPC  G01R 33/0017; G01R 15/205; G01R 33/091; G01R 33/096
  See application file for complete search history.

(56) References Cited

U.S. PATENT DOCUMENTS

| | | | |
|---|---|---|---|
| 2008/0084205 A1* | 4/2008 | Zimmer | B82Y 25/00 324/252 |
| 2011/0227560 A1* | 9/2011 | Haratani | B82Y 25/00 324/117 R |

\* cited by examiner

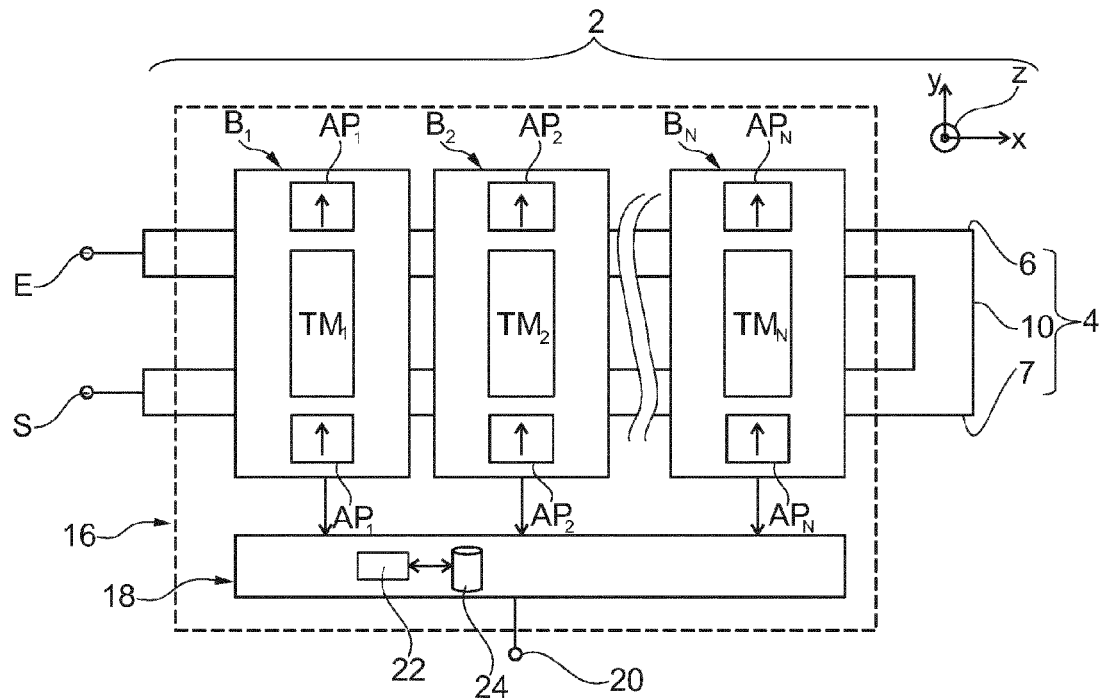
Fig. 1
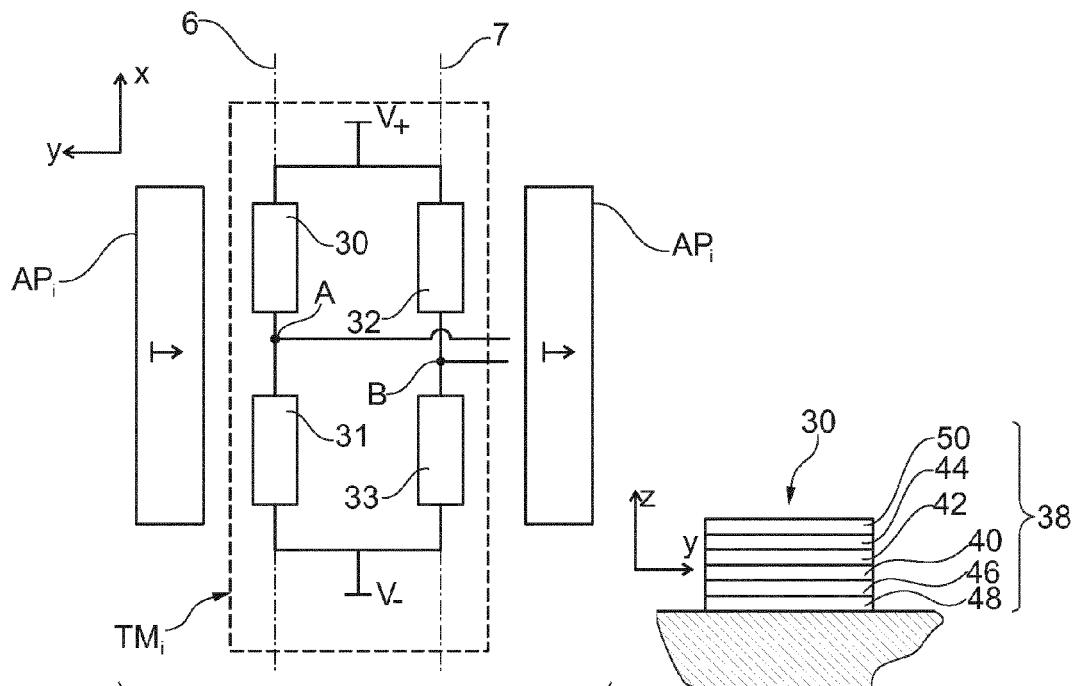
Fig. 2
Fig. 3

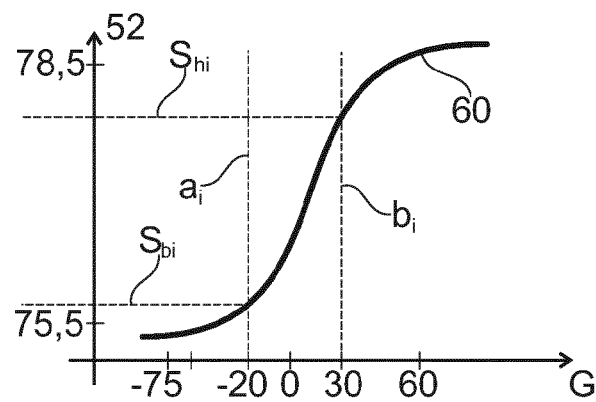
Fig. 4
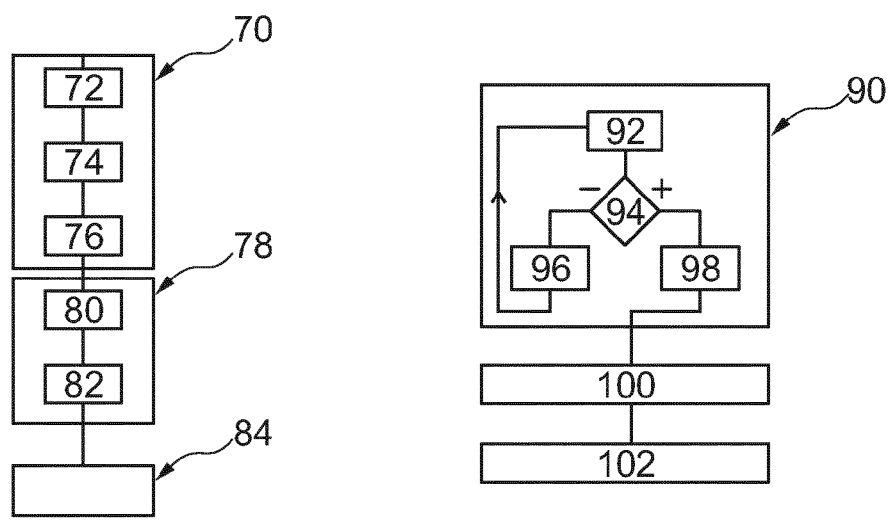
Fig. 5
Fig. 6

MAGNETIC FIELD SENSOR

RELATED APPLICATIONS

This application is a U.S. National Stage of international application No. PCT/EP2013/050155 filed Jan. 7, 2013, which claims the benefit of the priority date of French Patent Application FR 1250313 filed on Jan. 12, 2012, the contents of which are herein incorporated by reference.

FIELD OF INVENTION

The invention relates to a magnetic field sensor and a method for measuring a magnetic field. The invention relates also to a storage medium for the implementation of this method and a current sensor incorporating the magnetic field sensor.

BACKGROUND

Known current sensors comprise:
- an electrical conductor extending along a direction X and in which the current to be measured circulates,
- a magnetic field sensor fixed with no degree of freedom to this electrical conductor to measure the magnetic field generated by the current to be measured when it circulates in this electrical conductor, and
- a computer programmed to establish the measurement of the intensity of the current to be measured on the basis of the measurement of the intensity of the magnetic field measured by the magnetic field sensor.

The magnetic field sensor used in this current sensor comprises N magneto-resistive transducers $TM_i$, the resistance of each transducer $TM_i$ varying linearly to within $\pm x_i\%$ as a function of the intensity of the magnetic field to be measured within a maximum range $[a_i; b_i]$ of intensity of the magnetic field to be measured and non-linearly outside of this range, N being an integer number greater than or equal to two and the index i being an identifier of the transducer $TM_i$.

Such a current sensor is, for example, disclosed in the patent application US2011/0227560 or in the application WO2007148028.

In the current sensor of US2011/0227560, a compensation line is implemented to generate a magnetic field $H_d$ of a direction opposite to that of the magnetic field to be measured $H_m$. More specifically, the intensity of the field $H_d$ is enslaved onto that of the magnetic field $H_m$ to maintain the field $H_r$ resulting from the combination of these two fields $H_d$ and $H_m$ close to zero. It is this field $H_r$ which is measured by the magneto-resistive transducer. Since the field $H_r$ is maintained close to zero, the magneto-resistive transducer works within the range in which it is most linear, which increases its linearity.

The presence of such a field $H_d$ makes it possible to increase the range of measurements of the magneto-resistive transducer. "Range of measurements" here designates the maximum range over which the response of the magneto-resistive transducer varies linearly to within plus or minus x % as a function of the intensity of the field $H_m$ to be measured, where x is a predetermined constant.

The linearity to within ±x % over a range [a, b] is defined as follows: whatever the value of the intensity of the field $H_m$ to be measured within the range [a; b], the absolute value of a ratio β, expressed as a %, is less than the constant x, where the ratio β is defined by the following relationship: $\beta=(R_m(H_m)-D(H_m))/D(H_m)$, in which:

$R_m(H_m)$ is the value of the signal generated by the magneto-resistive transducer when it is placed in the field $H_m$, D is the straight regression line minimizing the deviations, according to the least squares method, between this straight line and the different values $R_m(H_m)$ measured over the entire extent of the range [a; b], $D(H_m)$ is the value of the straight regression line for the field $H_m$.

Hereinafter in this description, the range [a; b] is the maximum range, that is to say the greatest, over which the linearity of the magneto-resistive transducer is less than x %. Thus, setting the value of x makes it possible to also set the value of the bounds of the range [a; b]. Typically, the range [a; b] for a given value x is measured by trial and error.

In these known sensors, the energy consumption to generate the field $H_d$ is significant.

To increase the range of measurements of a magneto-resistive transducer, it has also already been proposed elsewhere to generate a constant magnetic field parallel to the direction of easiest magnetization of the free layer of the magneto-resistive bars forming this magneto-resistive transducer. Typically, this direction is at right angles to that of the field $H_m$ to be measured. The presence of this constant magnetic field makes it possible to effectively increase the range of measurements of the magneto-resistive transducer but to the detriment of the sensitivity of this transducer.

Prior art is also known from US2006/291106A1.

SUMMARY

The invention therefore aims to increase the range of measurements of a magneto-resistive transducer while reducing its energy consumption and without in any way reducing its sensitivity. Its subject is therefore a magnetic field sensor conforming to claim 1.

The above sensor exhibits N different ranges $[a_i+I_i; b_i+I_i]$ over which its measurement varies linearly instead of just one. Furthermore, over each range, its sensitivity is the same as that obtained in the absence of the magnetic field $CM_i$. Thus, the range of measurements is increased without in any way reducing its sensitivity. Furthermore, the use of permanent magnets to generate the magnetic fields $CM_i$ limits the energy consumption of the sensor.

The embodiments of this sensor can include one or more of the features of the dependent claims.

These embodiments of the magnetic field sensor also offer the following advantages:
choosing the magnetic fields $CM_i$ such that $a_i+I_{i+1} \leq b_i+I_i$, makes it possible to obtain a much more extensive continuous range $[a_1+I_1; b_N+I_N]$ than each range $[a_i; b_i]$ over which the resistance of the magneto-resistive transducer $TM_i$ varies linearly to within $\pm x_i$ %.

A current sensor comprising the above magnetic field sensor is also a subject of the invention.

A method for measuring a magnetic field conforming to claim 6 is also a subject of the invention.

The embodiments of this measurement method can include one or more of the features of the dependent method claims.

Finally, an information storage medium containing instructions for implementing the above measurement method, when these instructions are executed by an electronic computer, is also a subject of the invention.

The invention will be better understood on reading the following description, given solely as a nonlimiting example and with reference to the drawings.

BRIEF DESCRIPTION OF THE DRAWINGS

FIG. 1 is a schematic illustration of a current sensor using magneto-resistive transducers;

FIG. 2 is a schematic illustration of one of the magneto-resistive transducers of the sensor of FIG. 1;

FIG. 3 is a schematic illustration in vertical cross section of a magnetic bar implemented in the magneto-resistive transducer of FIG. 2;

FIG. 4 is a graph illustrating the response of the magnetic bar of FIG. 1 to a magnetic field;

FIG. 5 is a flow diagram of a method for measuring a current using the sensor of FIG. 1; and FIG. 6 is a flow diagram of another method for measuring the current using the sensor of FIG. 1.

In these figures, the same references are used to designate the same elements.

DETAILED DESCRIPTION

Hereinafter in this description, the features and functions that are well known to a person skilled in the art are not described in detail.

FIG. 1 represents a current sensor 2. This sensor 2 comprises an electrical conductor 4. The conductor 4 here comprises two rectilinear strands 6, 7 parallel to a horizontal direction X of an orthogonal reference frame X, Y, Z. In the reference frame X, Y, Z, the direction Y is also horizontal and the direction Z is vertical.

These strands 6, 7 are electrically connected together by an additional strand 10 such that the current to be measured circulates in one direction in the strand 6 and in the opposite direction in the strand 7. Here, these strands 6, 7 and 10 form a "U".

The strands 6, 7 are also connected, respectively, to input and output terminals E and S of the current to be measured.

An electrically insulating support rests, with no degree of freedom, on the strands 6 and 7 of the conductor 4. This support has not been represented to simplify FIG. 1. Hereinbelow, a material is considered to be insulating if its resistivity is greater than 1 Ω·m and, preferably, greater than $10^4$ Ω·m at 25° C.

The sensor 2 also comprises a magnetic field sensor 16 fixed with no degree of freedom onto this support. This sensor 16 measures a magnetic field $H_m$ generated by a current $I_m$ circulating in the conductor 4. The field $H_m$ is at right angles to the direction X.

This sensor 16 comprises a plurality of measurement blocks $B_1, \ldots, B_N$, where N is an integer number greater than or equal to two and, preferably, greater than or equal to four, five or ten. The index i identifies the measurement block concerned. The index i lies between one and N.

To simplify FIG. 1, only three blocks $B_1$, $B_2$, and $B_N$ are represented. In this figure, the vertical wavy lines indicate that blocks $B_i$ have not been represented.

The block $B_i$ measures the magnetic field $H_m$. To this end, each block $B_i$ comprises a magneto-resistive transducer $TM_i$ which will be described later with reference to FIG. 2.

Each block $B_i$ also comprises permanent magnets $AP_i$ to create a magnetic field $CM_i$ parallel to the direction Y in the transducer $TM_i$. Here, the direction Y is parallel to the direction of measurement of the field $H_m$. For example, each block $B_i$ comprises two permanent magnets $AP_i$ positioned on either side of the magneto-resistive transducer $TM_i$. In FIG. 1, the direction of magnetization of these permanent magnets is represented by an arrow. Thus, each measurement block differs from the other measurement blocks by the magnetic field $CM_i$ and also by its magneto-resistive transducer $TM_i$.

Except for the magnets with which they are equipped, all the blocks $B_i$ are here identical to one another. Thus, only the block $B_i$ is described in more detail with reference to FIG. 2.

The sensor 16 also comprises an electronic processing unit 18. This unit 18 is capable of establishing the measurement of the intensity of the field $H_m$ along the direction of measurement Y based on the measurements of the different blocks $B_i$. This unit 18 is also capable of establishing the intensity of the current $I_m$ on the basis of the measured intensity of the field $H_m$. The unit 18 reproduces the established intensity of the current $I_m$ on an output 20.

The unit 18 is connected to each block $B_i$ to acquire the measurement $H_{mi}$ produced by this block of the magnetic field $H_m$.

For example, the unit 18 is produced from a programmable electronic computer 22 capable of executing instructions stored on an information storage medium. To this end, the unit 18 comprises a memory 24 connected to the computer 22. This memory 24 stores the instructions needed to execute the method of FIG. 5 or 6.

The block $B_i$ comprises four magneto-resistive bars 30 to 33 (FIG. 2) electrically connected together to form a Wheatstone bridge. A magneto-resistive bar is a component whose resistivity varies as a function of the magnetic field in which it is placed. The magnetic bars concerned here are either spin valves or magnetic tunnel junctions.

This Wheatstone bridge comprises a first and a second branch electrically connected in parallel between reference potentials V+ and V−. The potential V− is, for example, the ground or the earth. The first branch comprises, in succession, going from the potential V+ to the potential V−, the magneto-resistive bars 30 and 31 connected in series via a midpoint A. The second branch comprises, in succession, going from the potential V+ to the potential V−, the bars 32 and 33 connected in series via a midpoint B.

The potentials $V_A$ and $V_B$ at the midpoints A and B are given by the following relationships:

$$V_A = (V_+ - V_-) R_2 / (R_1 + R_2)$$

$$V_B = (V_+ - V_-) R_4 / (R_3 + R_4)$$

in which $R_1$, $R_2$, $R_3$ and $R_4$ designate the respective resistances of the bars 30 to 33.

Here, each bar 30 to 33 is essentially a rectangular parallelepiped with at least two great faces extending horizontally. The direction in which the bar mainly extends is called longitudinal direction. Here, this direction is horizontal and parallel to the direction X. The transverse direction is parallel to the direction Y.

In the case where the bars are spin valves, preferably, each bar has a high aspect ratio, that is to say an aspect ratio greater than twenty and, preferably, greater than forty or one hundred. This aspect ratio is defined by the aspect ratio between the length L of the bar over its transverse width W.

For example, the length L is greater than 50 or 100 μm and, preferably, less than 1 mm. The transverse width W is typically greater than 0.3 μm or 1 μm and, preferably, less than 15 μm or 30 μm. The aspect ratio is much lower when the bar is a magnetic tunnel junction. In the latter case, the aspect ratio can be less than five or ten.

Here, the bars 30 and 31 are positioned above the strand 6 so as to be at least two or three times closer to this strand 6 than to the strand 7. Thus, the bars 30 and 31 are mainly sensitive to the magnetic field H, created by the current which circulates in the strand 6. In FIG. 2, the strands 6 and 7 are represented by axes bearing the same numeric references.

Similarly, the bars 32 and 33 are positioned above the strand 7 so as to be two or three times closer to this strand 7 than to the strand 6. Thus, the bars 32 and 33 are mainly sensitive to the magnetic field H, created by the current circulating in the strand 7.

The bars 31 and 32 are arranged in such a way that their respective resistances vary in the same direction in response to the same variation of the current $I_m$ to be measured. Here, the bars 31 and 32 are identical.

In this embodiment, the bars 30 and 33 are also identical to the bars 31 and 32. However, the block $B_i$ is arranged in such a way that their resistance does not vary in response to a variation of the intensity of the current $I_m$. For example, the block $B_i$ comprises a magnetic screen interposed between the bars 30 and 33 and the conductor 4.

The processing unit 18 receives the difference between the potentials $V_A$ and $V_B$ to establish the intensity of the current $I_m$ circulating in the conductor 4.

The structures of the different magneto-resistive bars are identical and only the structure of the bar 30 is described in more detail with reference to FIG. 3.

The bar 30 comprises a stack 38, immediately consecutive, of a reference layer 40, a spacer 42 and a free layer 44 in the vertical direction. Such a stack to obtain a giant magneto resistance or GMR (Giant Magneto-Resistance) is conventional. GMRs are also known as "spin valves". This stack will not therefore be described in detail.

The reference layer 40 has a magnetization of fixed direction and at right angles to the direction X. "Fixed direction" here describes the fact that the direction of magnetization of this layer is much more difficult to modify than the direction of magnetization of the free layer.

For example, the layer 40 is a ferromagnetic layer. It can be made of cobalt, nickel or iron or their alloys such as CoFe, NiFe, CoFeB or other such alloys.

The direction of magnetization of the layer 40 is set using an anti-ferromagnetic layer 46. The layer 46 serves to trap the direction of magnetization of the layer 40. For example, the layer 46 is made of a manganese alloy such as one of the following alloys: IrMn, PtMn, FeMn, NiMn or other such alloys.

The spacer 42 is a layer made of a non-magnetic material. This spacer 42 is thick enough to magnetically decouple the layers 40 and 44. Here, the spacer 42 is a layer of conductive material such as copper.

The free layer 44 has a direction of magnetization which can more easily rotate than that of the reference layer. The direction of easiest magnetization of this layer 44 is here parallel to the longitudinal direction of the bar, that is to say, the direction X. For example, the layer 44 is a layer made of ferromagnetic material or a stack of ferromagnetic layers.

The stack 38 comprises, at each end, a conductive electrode, respectively, 48 and 50, to circulate the current which passes through the magneto-resistive bar at right angles to the plane of the layers 40, 42 and 44.

To simplify FIG. 3, the ratios of thicknesses between the different layers of the stack 38 have not been observed in this figure.

The variation of the resistance of the magneto-resistive bar 30 as a function of the intensity of a magnetic field inside which it is placed is represented in FIG. 4 by a curve 60. The X axis is graduated in Gauss and the Y axis represents the resistance of the bar 30 expressed in Ohm.

In this figure, the curve 60 varies linearly to within plus or minus $x_i$ % within a range $[a_i; b_i]$ centered around the zero field. Here, the value $x_i$ is chosen to be less than 20% or 10% and, preferably, less than 5% or 1% or 0.5%. For example, in this embodiment, the value $x_i$ is chosen to be equal to 1% or 0.25%. In these conditions, the bounds $a_i$ and $b_i$ are substantially equal, respectively, to −20 G and +30 G. In this embodiment, the value $x_i$ is the same for all the blocks $B_i$.

Over the range $[a_i; b_i]$, the resistance of the bar 30 varies linearly between a low threshold $S_{bi}$ and a high threshold $S_{hi}$. The values of the bounds $a_i$, $b_i$ and of the thresholds $S_{hi}$ and $S_{bi}$ are known. For example, they are measured by trial and error. Outside of the range $[a_i; b_i]$, the response of the bar 30 varies non-linearly. "Non-linearly" means that, if the value of the bound $a_i$ were diminished or if the value of the bound $b_i$ were increased then the response of the bar 30 would no longer be linear to within $\pm x_i$ % over this new range $[a_i; b_i]$.

More specifically, the curve 60 increases non-linearly from approximately −75 G to $a_i$ then from $b_i$ to approximately 60 G. Below −75 G and above 60 G, the bar 30 is saturated. When the bar 30 is saturated, its resistance no longer varies as a function of the intensity of the magnetic field $H_m$ to be measured.

Since the response of the bar 30 is linear within the range $[a_i; b_i]$, the response of the magneto-resistive transducer $TM_i$ varies also linearly to within $\pm x_i$ % within the range $[a_i; b_i]$.

The sensitivity of the bar 30 is a function of the slope of the straight regression line within the range $[a_i; b_i]$. More specifically, the greater the slope, the greater the sensitivity of the bar 30. Now, the greater the sensitivity of the bar, the greater the sensitivity of the transducer $TM_i$ also.

It will be noted at this stage that, if, as in the prior art, a magnetic field is generated parallel to the direction of easiest magnetization of the free layer of the bar, then the extent of the range $[a_i; b_i]$ increases but the slope of the straight regression line within this range becomes less steep. Thus, as explained previously, any attempt to increase the range $[a_i; b_i]$ by applying a magnetic field along the direction X reduces the sensitivity of the magneto-resistive bar and therefore of the magneto-resistive transducer incorporating this bar. Conversely, the embodiment described here makes it possible to increase the range $[a_i; b_i]$ without reducing the sensitivity of the sensor.

To this end, each block $B_i$ comprises at least one magnet, here, the magnets $AP_i$, which generate a uniform magnetic field $CM_i$ in the block $B_i$. It is considered that the magnetic field $CM_i$ is uniform if the intensity of this magnetic field is the same in each magnetic bar 30 to 33 to within ±20% and, preferably, to within ±10 or 5 or 1%.

Each magnetic field $CM_i$ is constant and independent of the field $H_m$. In other words, the intensity of the field $CM_i$ does not vary systematically in response to a variation by several Gauss of the intensity of the field $H_m$. The intensity of the field $CM_i$ is hereinafter denoted $I_i$.

In this embodiment, the field $CM_i$ is generated by two magnets $AP_i$ placed respectively to the right and to the left of the transducer $TM_i$ in the direction Y.

The field $CM_i$ combines with the field $H_m$ to form a resultant magnetic field $H_{ri}$ whose intensity is equal to the difference between the intensity of the field $H_m$ and the intensity $I_i$.

The transducer $TM_i$ measures the intensity of the field $H_{ri}$ and not directly the intensity of the field $H_m$. Since the field $CM_i$ is constant, the range, within which the response of the magnetic transducer $TM_i$ is linear, is offset and becomes $[a_i+I_i; b_i+I_i]$. This offset in no way modifies the sensitivity of the transducer $TM_i$.

The other blocks $B_i$ are identical to the one described here in detail except that their permanent magnets $AP_i$ generate a magnetic field $CM_i$ of different intensity $I_i$.

Here, the different magnetic fields $CM_i$ are chosen such that all the ranges $[a_i+I_i; b_i+I_i]$ overlap. Here, the intensities $I_i$ are ranked in ascending order of index i such that this overlap translates into the following relationship: $a_{i+1}+I_{i+1} \leq b_i+I_i$. Preferably, the intensities of the magnetic fields $CM_i$ are chosen such that $a_{i+1}+I_{i+1}=b_i+I_i$ to within ±5% or 15%. Hereinafter in this description, the intensity $I_i$ is negative if the direction of magnetization of the permanent magnet is opposite to the direction Y.

Here, out of the different blocks $B_i$, one of these blocks, denoted $B_k$, has no permanent magnet such that the intensity $I_k$ is zero.

The overlap of the different ranges $[a_i+I_i; b_i+I_i]$ forms a great range $[a_1+I_1; b_N+I_N]$ in which the response of the sensor 16 varies linearly to within $\pm x_i$ % as explained below.

The combining of the different permanent magnets $AP_i$ forms a magnetic field generator capable of generating the N magnetic fields $CM_i$.

The operation of the sensor 2 will now be described with reference to the method of FIG. 5.

It is assumed that the current $I_m$ circulates in the conductor 4, which generates the field $H_m$ in each of the blocks $B_i$.

Initially, in a step 70, the computer 22 selects the block $B_i$ for which the intensity of the field $H_m$ lies within the range $[a_i+I_i; b_i+I_i]$. For this, in an operation 72, the block $B_k$ measures an intensity of the field $H_m$. The duly measured intensity is then acquired by the computer 22.

Then, in an operation 74, the computer 22 estimates the intensity of the field $H_m$ using the measurement acquired from the block $B_k$. This measurement is converted into an estimation $H_{em}$ of the intensity of the magnetic field $H_m$ by using a prestored calibration curve such as the curve 60 of FIG. 4. Such an estimation can be constructed on the basis of the curve 60 as long as the bars of the block $B_k$ are not saturated. In this case, the estimation $H_{em}$ is accurate if the latter lies within the range $[a_k; b_k]$. Outside this range, a less accurate estimation can be constructed by using the non-linear zones of the curve 60. By contrast, if the bars of the block $B_k$ are saturated, then the steps 72 and 74 are reiterated by using another block $B_i$, in which the index i is different from the index k. More specifically, if the bars are saturated in their low part, then the index i of the block used in place of the block $B_k$ is chosen to be equal to the integer part of k/2. If the block $B_k$ is saturated in its high part beyond the threshold $S_{hi}$, then the value of the index i for the block $B_i$ which will be used in place of the block $B_k$ is chosen to be equal to the integer part of N−k/2.

At the end of the step 74, an estimation $H_{em}$ is obtained. Then, in an operation 76, the computer 22 selects the block $B_s$ out of all the blocks $B_i$ for which the estimated intensity $H_{em}$ lies within the range $[a_s+I_s; b_s+I_s]$.

Then, in a step 78, the computer 22 establishes the measurement of the intensity of the field $H_m$. For this, in an operation 80, the block $B_s$ measures the field $H_m$ and the measurement that is thus produced is acquired by the computer 22. Then, in an operation 82, the computer 22 establishes the measurement of the intensity of the field $H_m$ only on the basis of the measurement of the block $B_s$.

Thus, the measurement range of the sensor 16 corresponds to the combination of the different ranges $[a_i+I_i; b_i+I_i]$ whereas its sensitivity remains identical to that of the non-saturated blocks $B_i$. More specifically, the measurement range of the sensor 2 is then the range $[a_1+I_1; b_N+I_N]$ which is much wider than the measurement range of a single block $B_i$.

Then, in a step 84, the computer 22 also establishes the measurement of the intensity of the current $I_m$ on the basis of the measurement of the intensity of the field $H_m$ established in the step 78.

FIG. 6 represents another operating method for the sensor 2.

In a step 90, the computer 22 selects the block $B_i$ for which the intensity of the field $H_m$ lies within the range $[a_i+I_i; b_i+I_i]$. For this, in an operation 92, each block $B_i$ measures the intensity of the field $H_m$ and the computer 22 acquires each of these measurements. Thus, in this operation 92, the computer 22 acquires N measurements $H_{mi}$ of the intensity of the field $H_m$.

Then, in an operation 94, for a block $B_i$, the computer compares the measurement $H_{mi}$ with the thresholds $S_{hi}$ and $S_{bi}$ of this block $B_i$. If the measurement $H_{mi}$ does not lie within the range $[S_{bi}; S_{hi}]$, then the computer proceeds with an operation 96. In the operation 96, the block $B_i$ is not selected then there is a return to the operation 94 to test the measurement $H_{mi}$ of another block.

Otherwise, in an operation 98, the block $B_i$ is selected.

Then, in a step 100, the measurement of the intensity of the field $H_m$ is established by the computer 22 by using only the measurement of the block $B_i$ selected in the step 90.

In a step 102, the computer 22 also establishes the measurement of the intensity of the current $I_m$ based on the measurement of the intensity of the field $H_m$ established in the step 100.

Numerous other embodiments are possible. For example, the number of magnets used to form the magnetic field generator can be different. For example, in a simplified case, a single magnet is used in each block $B_i$. On the other hand, more than two magnets can be used for each block $B_i$. In another simplified embodiment, a single magnet common to all the blocks $B_i$ is used. In this case, this single magnet is associated with magnetic flux guides making it possible to guide the magnetic flux that it generates in each block $B_i$. Furthermore, this magnetic flux guide is arranged such that the magnet delivers, at each block $B_i$, the magnetic field $CM_i$ that has the right intensity. The magnets can be arranged at the individual magneto-resistive bar level or, on the other hand, be common to a set of magneto-resistive bars of one and the same Wheatstone bridge.

The magnetic field generator can also comprise means for generating a magnetic field in each block $B_i$ parallel to the direction of easiest magnetization of the free layer of the magnetic bars. This makes it possible to reduce the hysteresis of the magnetic bars. For example, for this, each magnet $AP_i$ is replaced by a magnet whose direction of magnetization is inclined by an angle α between]0°; 90°[ relative to the direction Y.

The magneto-resistive transducers can be produced in different ways. For example, the magneto-resistive transducer is produced from a single magneto-resistive bar. In this case, no Wheatstone bridge is used.

In another embodiment, a configuration of the Wheatstone bridge other than that previously described is used. For example, reference will be able to be made on this subject to the different Wheatstone bridges described in the application US 2011/0227560.

The magneto-resistive bars used in each magneto-resistive transducer are not necessarily the same as those used in the other magneto-resistive transducers. Thus, the range $[a_i;$ $b_j$] within which the response of the transducer $TM_i$ is linear to within plus or minus $x_i$ % is not necessarily the same as the range [$a_j$; $b_j$] within which the response of the transducer $TM_j$ is linear to within plus or minus $x_j$ %, $x_i$ and $x_j$ being equal. Similarly, the thresholds $S_{hi}$ and $S_{bi}$ are not necessarily all identical from one block $B_i$ to another.

The linearity of the magnetic field sensor is not necessarily the same over each range of the measurement range. For example, over the range [$a_i$; $b_i$], the latter can be set at $x_i$ % and the linearity over another range [$a_j$; $b_j$] can be set at to within $x_j$ %, where $x_i$ and $x_j$ are different values.

Other embodiments of the magneto-resistive bars are possible. For example, the magneto-resistive bar is arranged to form a magnetic tunnel junction using the tunnel effect better known by the acronym TMR (Tunnel Magnetoresistance). In a tunnel junction, the spacer is made of an insulating non-magnetic material. For example, it can be an oxide or a nitride of aluminum. For example, the spacer is made of alumina $Al_2O_3$, manganese oxide MgO or strontium titenate ($SrTiO_3$) or other such compounds.

The conductor 4 can also be configured in different ways. For example, it may comprise only a single strand over which the current sensor 2 is placed.

The estimation $H_{em}$ of the intensity of the field $H_m$ can be constructed from a measurement of a magnetic field sensor other than the blocks $B_i$. For example, the magnetic field sensor then comprises an additional transducer, typically less accurate but with a very wide measurement range, used only to produce the estimation $H_{em}$. This other transducer is not necessarily a magneto-resistive transducer. For example, it can be a Hall-effect transducer.

The embodiments described in the application US 2011/0227560 and those described here can be combined together. In this case, a compensation line in which the compensation current $I_d$ described in the application US 2011/0227560 circulates is added in each block $B_i$.

Given that there can be ranges [$a_i$; $b_i$] and [$a_{i+1}$; $b_{i+1}$] which overlap, the estimation $H_{em}$ may lie within both ranges at the same time. In this case, the computer 22 can select the two blocks $B_i$ and $B_{i+1}$ to establish the measurement of the intensity of the field $H_m$. In another variant, it is not necessary for the ranges [$a_i$; $b_i$] to overlap. Some of these ranges can then be unconnected with one another and therefore separated from one another by a range within which the measurement is not linear.

The invention claimed is:

1. A sensor of magnetic fields along a direction of measurement, the sensor comprising
   N magneto-resistive transducers $TM_i$, a resistance of each transducer $TM_i$ varying linearly to within ±$x_i$% as a function of an intensity of a magnetic field to be measured within a maximum range [$a_i$; $b_i$] of intensity of the magnetic field to be measured and non-linearly outside of this range, wherein $x_i$ is a non-negative real number, and wherein $a_i$ and $b_i$ are real numbers that define the maximum range over which linearity of said magneto-resistive transducer $TM_i$ is less than $x_i$%, wherein $a_i$ is less than $b_i$, the index i being an identifier of the transducer $TM_i$, wherein the sensor further comprises
   a generator is configured to generate N magnetic fields $CM_i$ using at least two permanent magnets, each magnetic field $CM_i$ having an intensity $I_i$ in the direction of measurement, the intensity $I_i$ being constant and independent of the intensity of the magnetic field to be measured, each transducer $TM_i$ being placed inside a respective magnetic field $CM_i$, each transducer $TM_i$ placed inside the magnetic field $CM_i$ forming a measurement block ($B_i$) for which the range in which the resistance of the transducer $TM_i$ of said block varies linearly to within ±$x_i$% is offset by $I_i$ and becomes [$a_i+I_i$; $b_i+I_i$], each intensity $I_i$ being different from the others so as to obtain N different ranges [$a_i+I_i$; $b_i+I_i$] being an integer number greater than or equal to two, wherein $x_i$ is a non-negative real number, and wherein $a_i$ and $b_i$ are real numbers that define the maximum range over which linearity of said magneto-resistive transducer $TM_i$ is less than $x_i$%, wherein $a_i$ is less than $b_i$, and
   a processor configured to select one or more measurement blocks for which the intensity of the magnetic field to be measured lies within the range [$a_i+I_i$; $b_i+I_i$] of the block, and to establish the measurement of the intensity of the magnetic field on the basis of the measurement of only the one or more measurement blocks selected.

2. The sensor as claimed in claim 1, wherein the intensities $I_i$ increase as a function of the index i and the generator is configured to generate N fields $CM_i$ such that the following relationship is borne out regardless of i: $a_{i+1}+I_{i+1} \leq b_i+I_i$.

3. The sensor as claimed in claim 1, wherein, regardless of i, the value $x_i$ is less than 20%.

4. The sensor as claimed in claim 1, wherein each magneto-resistive transducer further comprises at least one magneto-resistive bar comprising a stack of at least a first magnetic layer,
   a second magnetic layer, and a non-magnetic layer, wherein said first magnetic layer is a reference layer that has a direction of magnetization that is fixed and that is at right angles to the longitudinal direction of the magnetic bar to within plus or minus 10°, wherein said second magnetic layer is a free layer having an axis of easiest magnetization that is parallel to the longitudinal direction and for which the magnetization can rotate when the free layer is subjected to the magnetic field to be measured, and wherein said non-magnetic layer is a spacer that is interposed between the two preceding layers to form a tunnel junction or a spin valve.

5. A current sensor comprising:
   an electrical conductor extending along a direction X and in which the current to be measured circulates, a magnetic field sensor fixed with no degree of freedom to this electrical conductor to measure the magnetic field generated by the current to be measured when the current circulates in the electrical conductor, and
   a processor programmed to establish the measurement of the intensity of the current to be measured on the basis of the measurement of the intensity of the magnetic field measured by the magnetic field sensor, wherein the magnetic field sensor comprises N magneto-resistive transducers $TM_i$, a resistance of each transducer $TM_i$ varying linearly to within ±$x_i$% as a function of an intensity of a magnetic field to be measured within a maximum range [$a_i$; $b_i$] of intensity of the magnetic field to be measured and non-linearly outside of this range, the index i being an identifier of the transducer $TM_i$, wherein $x_i$ is a non-negative real number, and wherein $a_i$ and $b_i$ are real numbers that define the maximum range over which linearity of said magneto-resistive transducer $TM_i$ is less than $x_i$%, wherein $a_i$ is less than $b_i$, wherein the sensor further comprises
   a generator configured to generate N magnetic fields $CM_i$ using at least two permanent magnets, each magnetic field $CM_i$ having an intensity $I_i$ in the direction of measurement, the intensity $I_i$ being constant and independent of the intensity of the magnetic field to be measured, each transducer $TM_i$ being placed inside a respective magnetic field $CM_i$, each transducer $TM_i$ placed inside the magnetic field $CM_i$ forming a measurement block for which the range in which the resistance of the transducer $TM_i$ of said block varies linearly to within $\pm x_i\%$ is offset by $I_i$ and becomes $[a_i+I_i; b_i+I_i]$, wherein $x_i$ is a non-negative real number, and wherein $a_i$ and $b_i$ are real numbers that define the maximum range over which linearity of said magneto-resistive transducer $TM_i$ is less than $x_i\%$, wherein $a_i$ is less than $b_i$, each intensity $I_i$ being different from the others so as to obtain N different ranges $[a_i+I_i; b_i+I_i]$, N being an integer number greater than or equal to two, wherein the processor is configured to select one or more measurement blocks for which the intensity of the magnetic field to be measured lies within the range $[a_i+I_i; b_i+I_i]$ of the block, and to establish the measurement of the intensity of the magnetic field on the basis of the measurement of only the one or more measurement blocks selected.

6. A method for measuring a magnetic field along a direction of measurement, the method comprising supplying N magneto-resistive transducers $TM_i$, a resistance of each transducer $TM_i$ varying linearly to within $\pm x_i\%$ as a function of an-intensity of the magnetic field to be measured within a maximum range $[a_i; b_i]$ of intensity of the magnetic field to be measured and non-linearly outside of this range, the index i being an identifier of the transducer $TM_i$, wherein $x_i$ is a non-negative real number, and wherein $a_i$ and $b_i$ are real numbers that define the maximum range over which linearity of said magneto-resistive transducer $TM_i$ is less than $x_i\%$, wherein $a_i$ is less than $b_i$, wherein the method further comprises generating N magnetic fields $CM_i$ using at least two permanent magnets, each field $CM_i$ having an intensity $I_i$ in the direction of measurement, the-intensity $I_i$ being constant and independent of the intensity of the magnetic field to be measured, each transducer $TM_i$ being placed inside a respective field $CM_i$, each transducer $TM_i$ placed inside the magnetic field $CM_i$ forming a measurement block for which the range in which the resistance of the transducer $TM_i$ of said block varies linearly to within $\pm x_i\%$ is offset by $I_i$ and becomes $[a_i+I_i; b_i+I_i]$, each intensity $I_i$ being different from the others so as to obtain N different ranges $[a_i+I_i; b_i+I_i]$, N being an integer number greater than or equal to two, wherein $x_i$ is a non-negative real number, and wherein $a_i$ and $b_i$ are real numbers that define the maximum range over which linearity of said magneto-resistive transducer $TM_i$ is less than $x_i\%$, wherein $a_i$ is less than $b_i$, and selecting the one or more measurement blocks for which the intensity of the magnetic field to be measured lies within the range $[a_i+I_i; b_i+I_i]$ of this block, and establishing the measurement of the intensity of the magnetic field on the basis of the measurement of the only one or more measurement blocks selected.

7. The method as claimed in claim 6, further comprising constructing an estimation $H_{em}$ of the intensity of the magnetic field to be measured, and selecting the appropriate measurement block or blocks as a function of this estimation $H_{em}$.

8. The method as claimed in claim 6, further comprising acquiring the measurement of the magnetic field produced by a measurement block, and selecting said measurement block only if the measurement produced by the block lies between predetermined high and low thresholds.

9. A non-transitory machine-readable medium containing program instructions that, when executed by a processor, cause the processor to implement a method that comprises supplying N magneto-resistive transducers $TM_i$, a resistance of each transducer TMi varying linearly to within $\pm xi\%$ as a function of an intensity of the magnetic field to be measured within a maximum range [ai; bi] of intensity of the magnetic field to be measured and non-linearly outside of this range, the index i being an identifier of the transducer TMi, wherein $x_i$ is a non-negative real number, and wherein $a_i$ and $b_i$ are real numbers that define the maximum range over which linearity of said magneto-resistive transducer $TM_i$ is less than $x_i\%$, wherein $a_i$ is less than $b_i$, generating N magnetic fields CMi using at least two permanent magnets, each field CMi having an intensity Ii in the direction of measurement, the intensity Ii being constant and independent of the intensity of the magnetic field to be measured, each transducer TMi being placed inside a respective field CMi, each transducer TMi placed inside the magnetic field CMi forming a measurement block for which the range in which the resistance of the transducer TMi of said block varies linearly to within $\pm xi\%$ is offset by Ii and becomes [ai+Ii; bi+Ii], wherein $x_i$ is a non-negative real number, and wherein $a_i$ and $b_i$ are real numbers that define the maximum range over which linearity of said magneto-resistive transducer $TM_i$ is less than $x_i\%$, wherein $a_i$ is less than $b_i$, each intensity Ii being different from the others so as to obtain N different ranges [ai+Ii; bi+Ii], N being an integer number greater than or equal to two, and selecting the one or more measurement blocks for which the intensity of the magnetic field to be measured lies within the range [ai+Ii; bi+Ii] of this block, wherein $a_i$ and $b_i$ are real numbers that define the maximum range over which linearity of said magneto-resistive transducer $TM_i$ is less than $x_i\%$, wherein $a_i$ is less than $b_i$, and establishing the measurement of the intensity of the magnetic field on the basis of the measurement of only the one or more measurement blocks selected.

10. The sensor as claimed in claim 1, wherein, regardless of i, the value $x_i$ is less than 10%.

11. The sensor as claimed in claim 1, wherein, regardless of i, the value $x_i$ is less than 5%.

12. The sensor of claim 1, wherein an offset associated with a block differs from other offsets associated with other blocks.

13. The sensor of claim 1, wherein said processor is configured to select a measurement block that has an offset that spans a range within which lies the intensity of the magnetic field that is to be measured.

14. The sensor of claim 1, wherein said processor is configured to obtain said measurement of said intensity only on the basis of said one or more measurement blocks selected.

* * * * *